(12) United States Patent
Onozawa

(10) Patent No.: US 7,198,978 B2
(45) Date of Patent: Apr. 3, 2007

(54) METHOD FOR FABRICATING SEMICONDUCTOR DEVICE AND APPARATUS FOR FABRICATING THE SAME

(75) Inventor: Kazutoshi Onozawa, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 57 days.

(21) Appl. No.: 11/033,304

(22) Filed: Jan. 12, 2005

(65) Prior Publication Data

US 2005/0164485 A1    Jul. 28, 2005

(30) Foreign Application Priority Data

Jan. 23, 2004    (JP)    ............................. 2004-015849

(51) Int. Cl.
*H01L 21/44* (2006.01)
*H01L 21/30* (2006.01)

(52) U.S. Cl. ...................... 438/106; 438/107; 438/455; 438/637

(58) Field of Classification Search ................ 438/106, 438/107, 455, 637, 678, 684, 687, 777; 257/678, 257/684, 687, 777
See application file for complete search history.

(56) References Cited

U.S. PATENT DOCUMENTS

| 5,545,291 A | 8/1996 | Smith et al. |
| 5,783,856 A | 7/1998 | Smith et al. |
| 5,824,186 A | 10/1998 | Smith et al. |
| 5,904,545 A | 5/1999 | Smith et al. |
| 6,919,641 B2 * | 7/2005 | Onozawa et al. ............ 257/777 |
| 2004/0063233 A1 * | 4/2004 | Onozawa ..................... 438/22 |

* cited by examiner

*Primary Examiner*—Hsien-Ming Lee
(74) *Attorney, Agent, or Firm*—McDermott Will & Emery LLP

(57) ABSTRACT

In a semiconductor-device fabrication method, a plurality of recessed portions are first formed in the principal surface of a substrate. Then, a through hole, passing through the substrate in the front-to-back direction of the substrate, is formed under a portion of the bottom of each recessed portion in the substrate. Subsequently, a plurality of semiconductor elements in the form of chips are spread in a liquid, and the semiconductor-element-spread liquid is poured over the principal surface of the substrate, while passing the liquid through the through holes, so that the semiconductor elements fit into the recessed portions in a self-aligned manner. In this way, the semiconductor elements are disposed into the recessed portions in the substrate in a self-aligned manner.

24 Claims, 15 Drawing Sheets

METHOD FOR FABRICATING SEMICONDUCTOR DEVICE AND APPARATUS FOR FABRICATING THE SAME

CROSS-REFERENCE TO RELATED APPLICATION

The disclosure of Japanese Patent Application No. 2004-15849 filed on Jan. 23, 2004 including specification, drawings and claims is incorporated herein by reference in its entity.

BACKGROUND OF THE INVENTION

The present invention relates to methods for fabricating semiconductor devices, which enable semiconductor elements to be mounted on a substrate in a self-aligned manner, and also relates to apparatuses for fabricating the semiconductor devices.

In recent years, mounting methods in which a fluidic self-assembly (hereinafter referred to as "FSA") technique is used have been developed as one type of device-mounting method.

In the FSA technique, devices (hereinafter referred to as "function blocks"), ranging in size from 10 μm to several hundred μm and having given shapes, are spread in a liquid to form a slurry. The liquid (suspension) in the form of slurry is poured over the surface of a substrate made of, e.g., silicon having therein recessed portions which are substantially the same in size and shape as the function blocks, whereby the function blocks spread in the liquid are disposed into the recessed portions and thereby mounted in the predetermined positions on the substrate.

FSA techniques are disclosed in U.S. Pat. No. 5,545,291, U.S. Pat. No. 5,783,856, U.S. Pat. No. 5,824,186 and U.S. Pat. No. 5,904,545, for example.

However, these conventional FSA techniques have the disadvantage of very low productivity, because the function blocks fall and are disposed into the recessed portions in the substrate randomly, and in order to make all of the recessed portions formed in the substrate have the function blocks therein, the function blocks have to be spread in large quantities over the surface of the substrate.

SUMMARY OF THE INVENTION

An object of the present invention is that the conventional problem mentioned above is overcome and in a semiconductor device in which a plurality of semiconductor elements (chips) are mounted onto a substrate, the semiconductor chips can be easily and reliably mounted even by using a FSA technique, i.e., by pouring a suspension including the semiconductor chips spread therein over the surface of the substrate.

In order to achieve the above object, in semiconductor-device fabrication methods according to the present invention, in which a FSA technique is used, a through hole, which passes through a substrate in the front-to-back direction of the substrate, is formed under the entire or a portion of the bottom of each recessed portion formed in the substrate. And when the solvent of a suspension flows through the through holes under the recessed portions, sucking force is made to occur above the recessed portions, thereby increasing the probability that semiconductor elements in the form of chips are disposed into the recessed portions in a self-aligned manner.

More specifically, a first inventive method for fabricating a semiconductor device includes: the step of forming a plurality of recessed portions in the principal surface of a substrate; the step of forming, in the substrate, through holes each passing through the substrate in a front-to-back direction of the substrate, each of the through holes being formed under a portion of the bottom of each recessed portion; and the step of spreading a plurality of semiconductor elements in the form of chips in a liquid and then pouring the semiconductor-element-spread liquid over the principal surface of the substrate, while passing the liquid through the through holes, so that the semiconductor elements fit into the recessed portions in a self-aligned manner, thereby disposing the semiconductor elements on the substrate.

In the first inventive semiconductor-device fabrication method, the through holes, passing through the substrate in the front-to-back direction of the substrate, are provided under the respective portions of the bottoms of the recessed portions in the substrate. Thus, when the liquid flows through the through holes formed under the recessed portions, sucking force is generated above the recessed portions. The sucking force occurring in the liquid causes the semiconductor elements to be sucked into the recessed portions. The semiconductor elements are thus effectively disposed into the recessed portions.

In the first inventive method, in the step of disposing the semiconductor elements, the liquid is preferably sucked from the through holes under the recessed portions.

A second inventive method for fabricating a semiconductor device includes: the step of forming, in the principal surface of a substrate, a plurality of through holes each passing through the substrate in a front-to-back direction of the substrate; and the step of spreading in a liquid a plurality of semiconductor elements in the form of chips, each having in a lower portion thereof a projection which fits in one of the through holes, and then pouring the semiconductor-element-spread liquid over the principal surface of the substrate, while passing the liquid through the through holes, so that the projections of the semiconductor elements fit into the through holes in a self-aligned manner, thereby disposing the semiconductor elements on the substrate.

In the second inventive semiconductor-device fabrication method, the through holes each passing through the substrate in the front-to-back direction of the substrate are provided in the principal surface of the substrate. Thus, when the liquid flows through the through holes formed in the substrate, sucking force is generated above the recessed portions. The sucking force occurring in the liquid causes the semiconductor elements to be sucked into the through holes. The semiconductor elements are thus effectively disposed into the through holes.

In the second inventive method, in the step of disposing the semiconductor elements, the liquid is preferably sucked from the through holes.

In the first and second inventive methods, in the step of disposing the semiconductor elements, the through holes are preferably selectively opened or closed. Then, when semiconductor elements of different types (functions), e.g., semiconductor laser elements with different wavelengths, are to be disposed on a single substrate, it is possible to dispose the desired semiconductor laser elements in the desired recessed portions, even if the semiconductor laser elements of different wavelengths have the same shape and the recessed portions have the same shape.

Moreover, the following configurations are preferable in order to selectively dispose different types of semiconductor elements.

Specifically, in the first and second inventive methods, in the step of disposing the semiconductor elements, the liquid is preferably sucked selectively from the through holes.

In the first and second inventive methods, it is preferable that in the step of disposing the semiconductor elements, insert members, which close the through holes from the side of the substrate opposite the principal surface of the substrate and are removable, are selectively inserted.

In this case, the insert members are preferably nozzles through which liquid or gas can pass.

In this case, liquid or gas is preferably injected from the nozzles.

Also, in this case, the insert members are preferably inserted so that the upper ends of the insert members protrude from the principal surface of the substrate.

In the first and second inventive methods, it is preferable that liquid or gas is selectively injected from the through holes to areas above the principal surface of the substrate.

In the first and second inventive methods, in the step of disposing the semiconductor elements, the liquid is preferably sucked from the through holes, thereby securing the semiconductor elements onto the substrate.

The first inventive method preferably further includes, before the step of disposing the semiconductor elements, the step of forming an element electrode on a face of each semiconductor element which faces the bottom of one of the recessed portions. In the first inventive method, the step of forming the recessed portions in the substrate preferably includes the step of forming a recess electrode on the bottom of each recessed portion, and in the step of disposing the semiconductor elements, each semiconductor element is preferably electrically connected with a corresponding one of the recess electrodes via the element electrode.

In this case, in the recess electrode formation step, each recess electrode is preferably formed so that an end portion thereof extends beyond the principal surface of the substrate.

In the first inventive method, in the step of forming the recessed portions in the substrate, the recessed portions are preferably formed so as to have different plan configurations in accordance with the shapes of the semiconductor elements.

The second inventive method preferably further includes, before the step of disposing the semiconductor elements, the step of forming an element electrode on the projection of each semiconductor element where the projection is in contact with one of the through holes. In the second inventive method, the step of forming the through holes in the substrate preferably includes the step of forming a recess electrode on a portion of the principal surface of the substrate surrounding each through hole or on an internal face of each through hole, and in the step of disposing the semiconductor elements, each semiconductor element is preferably electrically connected with a corresponding one of the recess electrodes via the element electrode.

In a first inventive apparatus for fabricating a semiconductor device, a liquid, in which a plurality of semiconductor elements in the form of chips have been spread, is poured over the principal surface of a substrate having a plurality of recessed portions formed in the principal surface, thereby disposing the semiconductor elements on the substrate. The inventive apparatus includes an element disposition portion, in which the semiconductor-element-spread liquid flows to dispose the semiconductor elements in the recessed portions. In the inventive apparatus, a through hole, passing through the substrate in a front-to-back direction of the substrate, is formed under a portion of the bottom of each recessed portion in the substrate; and openings for passing the liquid through the through holes formed under the recessed portions, to the side of the substrate opposite the principal surface of the substrate are formed in the element disposition portion.

In the first inventive semiconductor-device fabrication apparatus, the through holes passing through the substrate in the front-to-back direction of the substrate are formed under the respective portions of the bottoms of the recessed portions in the substrate and the openings, which allow the liquid to pass through the through holes under the recessed portions to the side of the substrate opposite the principal surface of the substrate, are formed in the element disposition portion. Consequently, when the liquid flows through the through holes formed under the recessed portions, sucking force is generated above the respective recessed portions. Since the sucking force occurring in the liquid causes the semiconductor elements to be sucked into the recessed portions, the semiconductor elements are effectively disposed into the recessed portions.

The first inventive apparatus preferably further includes sucking means, provided in the element disposition portion, for sucking the liquid from the through holes under the recessed portions.

In a second inventive apparatus for fabricating a semiconductor device, a liquid, in which a plurality of semiconductor elements in the form of chips have been spread, is poured over the principal surface of a substrate having a plurality of through holes formed in the principal surface, thereby disposing the semiconductor elements on the substrate, each through hole passing through the substrate in a front-to-back direction of the substrate. The inventive apparatus includes an element disposition portion, in which the semiconductor-element-spread liquid flows to dispose the semiconductor elements in the through holes. In the inventive apparatus, each semiconductor element has in its lower portion a projection which fits into one of the through holes, and openings for passing the liquid through the through holes to the side of the substrate opposite the principal surface of the substrate are formed in the element disposition portion.

In the second inventive semiconductor-device fabrication apparatus, the through holes passing through the substrate in the front-to-back direction of the substrate are formed in the substrate and the openings, which allow the liquid to pass through the through holes to the side of the substrate opposite the principal surface of the substrate, are formed in the element disposition portion. Consequently, when the liquid flows through the through holes formed in the substrate, sucking force is generated above the respective through holes. Since the sucking force occurring in the liquid causes the semiconductor elements to be sucked into the through holes, the semiconductor elements are effectively disposed into the through holes.

The second inventive apparatus preferably further includes sucking means, provided in the element disposition portion, for sucking the liquid from the through holes.

The first and second inventive apparatuses preferably further include opening/closing means, provided in the element disposition portion, for selectively opening or closing the through holes.

In the first and second inventive apparatuses, it is preferable that the sucking means selectively sucks the through holes.

The first and second inventive apparatuses preferably further include insert means, provided in the element disposition portion, for selectively inserting insert members for closing the through holes from the lower side of the substrate.

In this case, the insert members are preferably nozzles capable of injecting liquid or gas.

Also, in this case, the insert members are preferably inserted so that the upper ends of the insert members protrude from the principal surface of the substrate.

DESCRIPTION OF THE PREFERRED EMBODIMENTS

First Embodiment

Hereinafter, a first embodiment of the present invention will be described with reference to the accompanying drawings.

Figure 1:
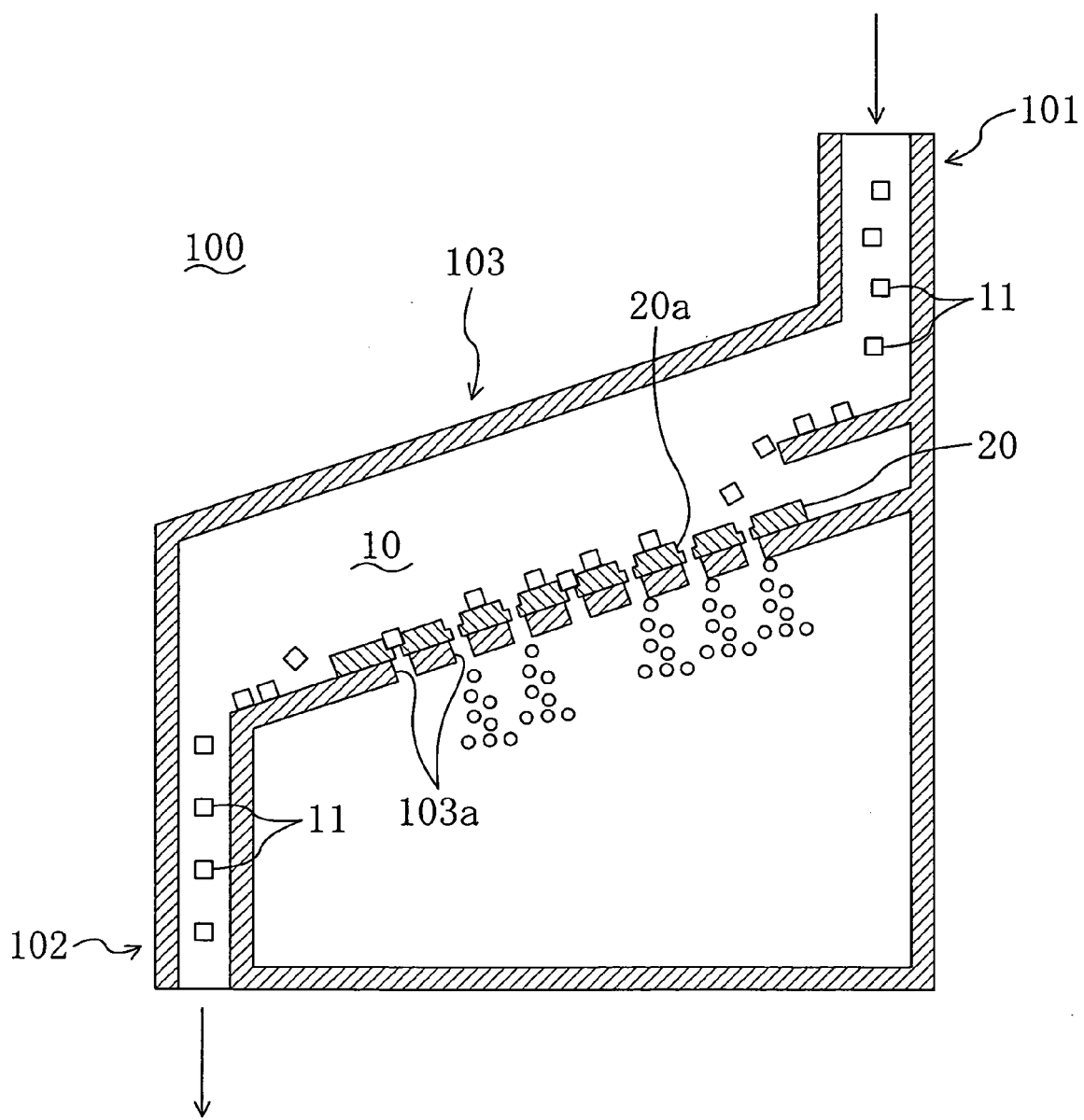
FIG. 1 schematically illustrates a cross sectional configuration of a semiconductor-device fabrication apparatus according to a first embodiment of the present invention.

FIG. 1 schematically illustrates a cross sectional configuration of a semiconductor-device fabrication apparatus according to the first embodiment of the present invention.

As shown in FIG. 1, a semiconductor-device fabrication apparatus 100, in which a FSA technique is used, includes a block disposition portion 103 having an inlet portion 101 and an outlet portion 102 at its upper and lower ends, respectively. From the inlet portion 101, a liquid 10 in the form of slurry, in which a plurality of semiconductor elements 11 in the form of chips (hereinafter referred to as "function blocks") have been spread, is supplied, and the liquid 10 supplied is discharged from the outlet portion 102.

The bottom face and upper face of the block disposition portion 103 are formed to be inclined with respect to the horizontal surface so that the liquid 10 supplied from the inlet portion 101 is discharged from the outlet portion 102 by gravity. A substrate-holding region, in which a substrate 20 formed with a plurality of recessed portions 20a is held, is formed in the inclined bottom face of the block disposition portion 103. In this embodiment, the liquid 10 serving as a solvent is, e.g., methyl alcohol or methyl alcohol to which water has been added.

Figure 2:
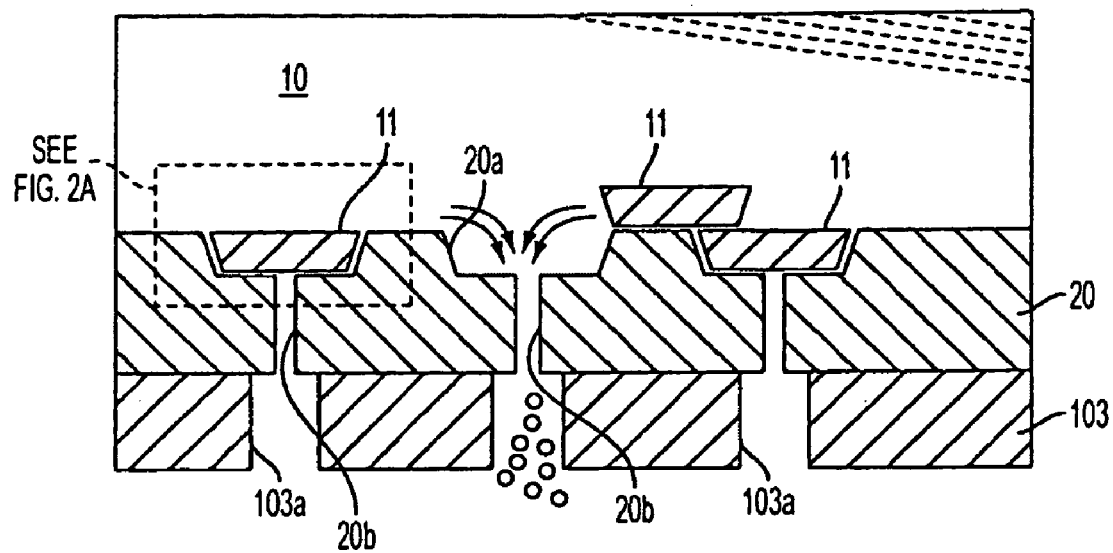
FIG. 2 is an enlarged view illustrating part of a cross sectional configuration of a block disposition portion and a substrate held thereon in the semiconductor-device fabrication apparatus of the first embodiment of the present invention.

As shown in an enlarged partial view in FIG. 2, the recessed portions 20a, into which the plurality of function blocks 11 fit and are disposed, are formed in the upper portion of the substrate 20. Under a portion of the bottom of each recessed portion 20a, a through hole 20b, which passes through the substrate 20 in the front-to-back direction, is formed.

Moreover, in the substrate-holding region of the block disposition portion 103, openings 103a are formed in positions facing the through holes 20b in the substrate 20.

In the first embodiment, as shown in FIG. 2, the liquid 10 in the form of slurry, in which the function blocks 11 have been spread, is supplied from the inlet portion 101 of the fabrication apparatus 100 over the substrate 20 and then flows toward the outlet portion 102. At this time, the upper and lower sides (i.e., the top and bottom sides) of the function blocks 11 spread in the liquid 10 are determined uniquely because the function blocks 11 have been processed to have an inverse trapezoidal shape in cross section. However, the function blocks 11 randomly fall into the recessed portions 20a in the substrate 20. Therefore, as shown in FIG. 1, the function blocks 11 that have not fallen into the recessed portions 20a are collected together with the liquid 10 discharged through the outlet portion 102 and are then supplied from the inlet portion 101 again.

Moreover, in the first embodiment, as shown in FIG. 2, in the empty recessed portions 20a in which no function blocks 11 have been disposed, the liquid 10 is externally discharged through the through holes 20b formed under the bottoms of the recessed portions 20a and then through the openings 103a formed in the positions in the block disposition portion 103 which face the through holes 20b. When the liquid 10 flows through the through holes 20b formed under the recessed portions 20a in the substrate 20, sucking force is generated above the recessed portions 20a. The sucking force occurring in the liquid 10 causes the function blocks 11 to be sucked into the empty recessed portions 20a. Thus, the function blocks 11 are effectively disposed into the recessed portions 20a formed in the substrate 20.

Figure 3:
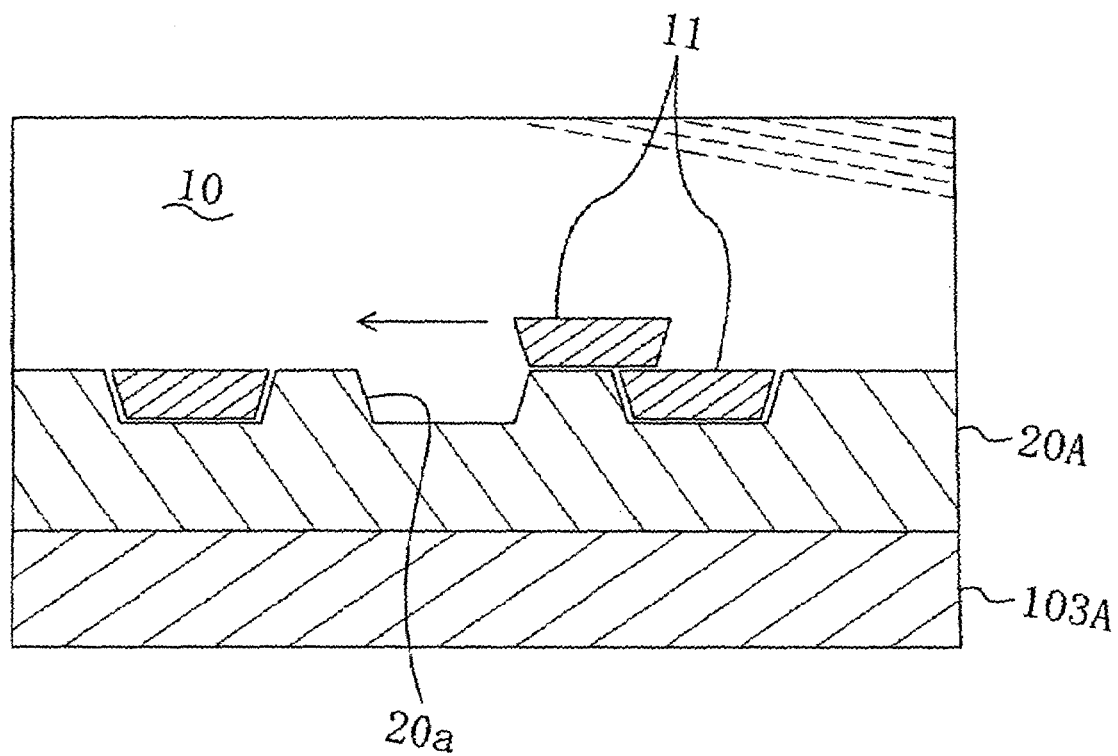
FIG. 3 is an enlarged view illustrating part of a cross sectional configuration of a substrate held in a conventional semiconductor-device fabrication apparatus.

For the sake of comparison, a case in which the conventional FSA technique is used will be discussed with reference to FIG. 3. As shown in FIG. 3, in the case of a conventional substrate 20A in which no through holes are formed under the bottoms of recessed portions 20a, even if a function block 11 comes near an empty recessed portion 20a, the function block 11 approaching the empty recessed portion 20a is not likely to be disposed into the empty recessed portion 20a due to the viscous resistance of a liquid 10 within the empty recessed portion 20a.

If the function blocks 11 are semiconductor laser chips, for example, p-side and n-side electrodes are formed on opposite faces, i.e., the upper and lower faces, of the laser chips in some cases.

In those cases, it is preferable that recess electrodes 23 made of low-melting-point metal such as solder material are formed on at least portions of the bottoms of the recessed portions 20a in the substrate 20. Furthermore, it is preferable that each recess electrode is formed so that an end portion thereof extends beyond the principal surface of the substrate 20.

Figure 2A:
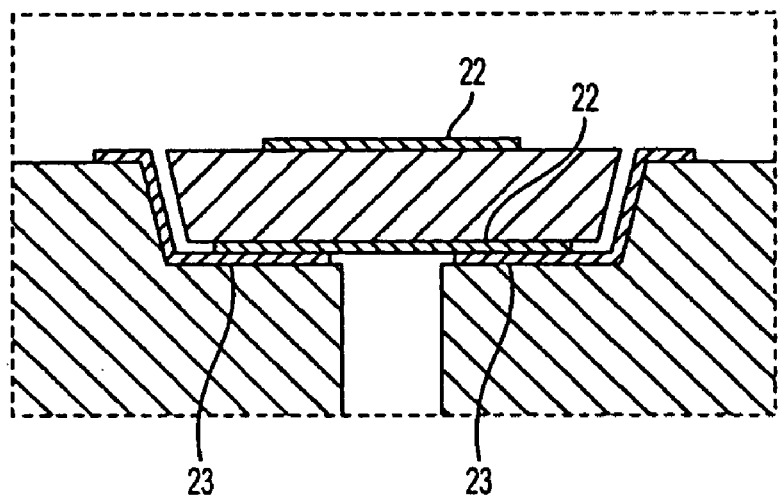
FIG. 2A is another enlarged view illustrating part of a cross sectional configuration of the connections of the element electrodes on the function blocks with the recess electrode on the recessed portion.

Then, if the substrate 20 is heated with the semiconductor laser chips being disposed in the recessed portions 20a in the substrate 20, the semiconductor laser chips are electrically connected with the recess electrodes 23 via the element electrodes 22 formed on the lower surfaces of the semiconductor laser chips, as shown in FIG. 2A.

Also, in a case where two types of semiconductor laser chips with different wavelengths, for example, are to be disposed into the recessed portions 20a in the substrate 20, the plan configurations of these two types of semiconductor laser chips may be made different from each other and the recessed portions 20a in the substrate 20 may also be formed to have different plan configurations in accordance with the plan configurations of the laser chips. Then, even if the two types of semiconductor laser chips are spread in the liquid 10 at the same time, these two kinds of semiconductor laser chips can be selectively disposed into the corresponding recessed portions 20a in a single process step.

Modified Example of the First Embodiment

Figure 4:
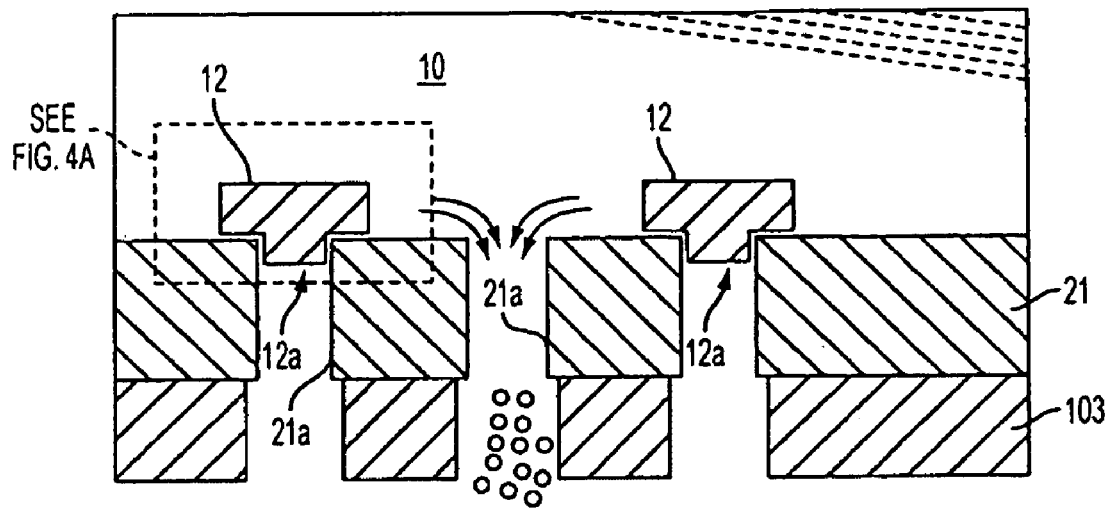
FIG. 4 is an enlarged view illustrating part of a cross sectional configuration of a block disposition portion and a substrate held thereon in a semiconductor-device fabrication apparatus according to a modified example of the first embodiment of the present invention.

Hereinafter, a modified example of the first embodiment of the present invention will be described with reference to FIG. 4. As shown in an enlarged partial view in FIG. 4, in a substrate 21 according to this modified example, through holes 21a are formed without forming any recessed portions. And function blocks 12 are each formed to have, on their lower side, a projection 12a which fits into one of the through holes 21a in the substrate 21.

In this modified example, sucking force is also generated above the through holes 21a, when a liquid 10 flows through the through holes 21a formed in the substrate 21. The sucking force produced in the liquid 10 causes the function blocks 12 to be sucked into the empty through holes 21a. As a result, the projections 12a of the function blocks 12 are effectively disposed into the through holes 21a formed in the substrate 21.

Figure 4A:
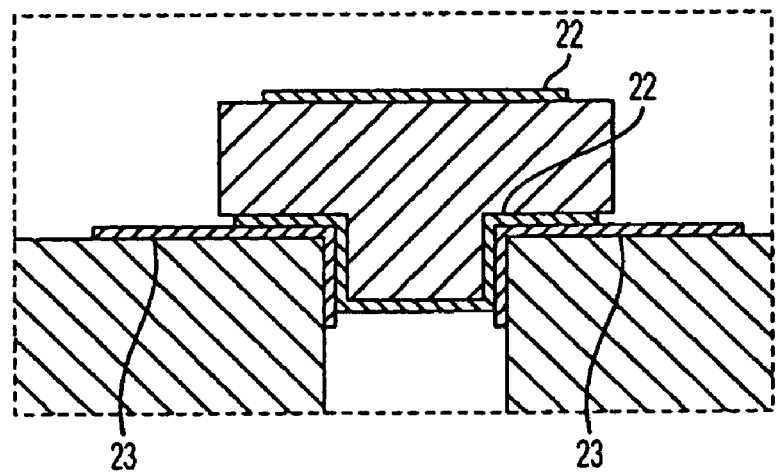
FIG. 4A is another enlarged view illustrating part of a cross sectional configuration of the connections of the element electrodes on the function blocks with the recess electrode on the recessed portion.

If the function blocks 12 are, e.g., semiconductor laser chips, it is also desirable in this modified example that a p-side or n-side element electrode 22 is formed on the projection 12a of each semiconductor laser chip where the projection 12a is in contact with one of the through holes 21a and that a recess electrode 23 is formed on a portion of the principal surface of the substrate 21 surrounding each through hole 21a or on an internal face of each through hole 21a in the substrate 21, as shown in FIG. 4A.

Second Embodiment

Hereinafter, a second embodiment of the present invention will be described with reference to the accompanying drawings.

Figure 5:
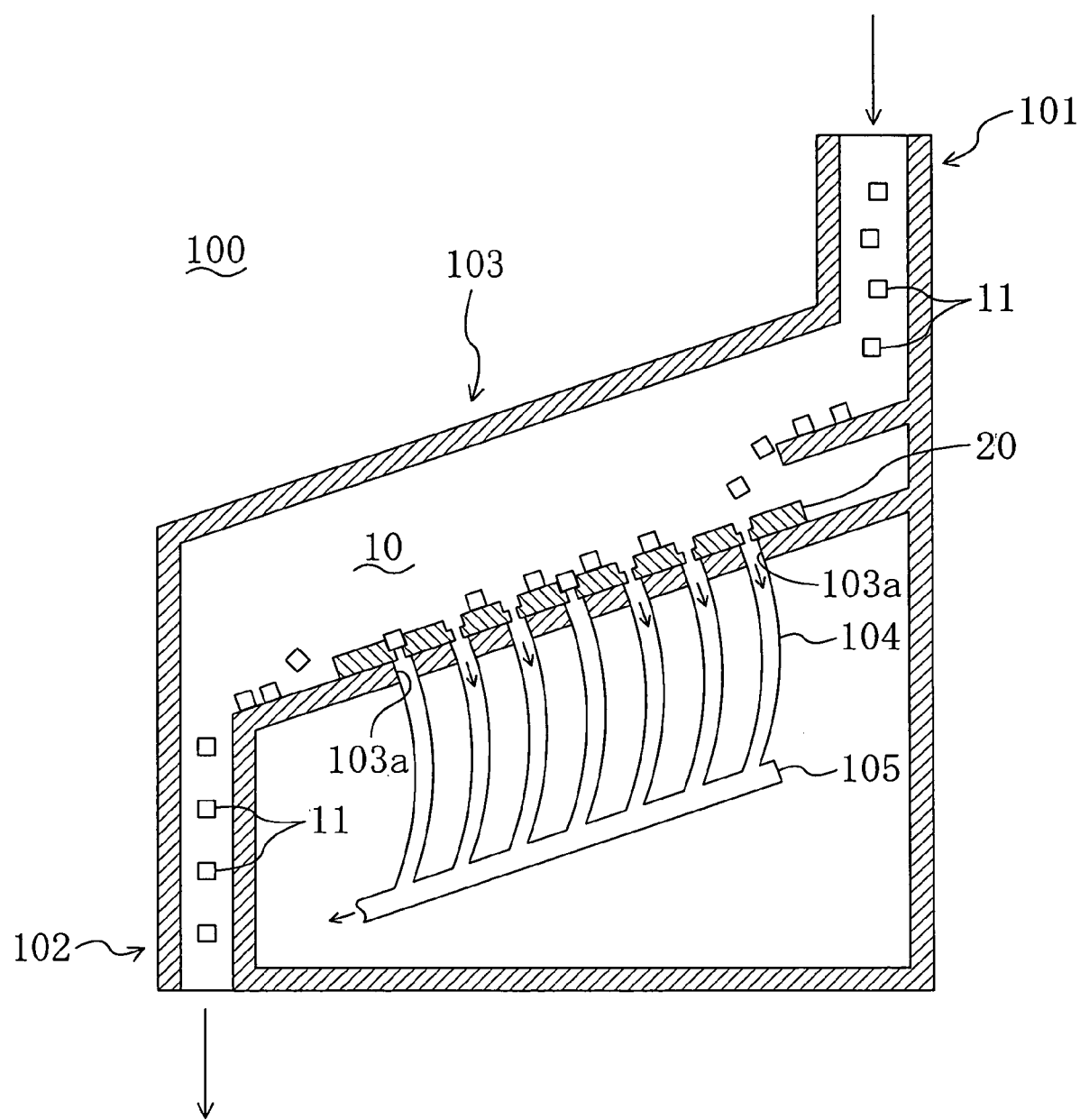
FIG. 5 schematically illustrates a cross sectional configuration of a semiconductor-device fabrication apparatus according to a second embodiment of the present invention.
Figure 6:
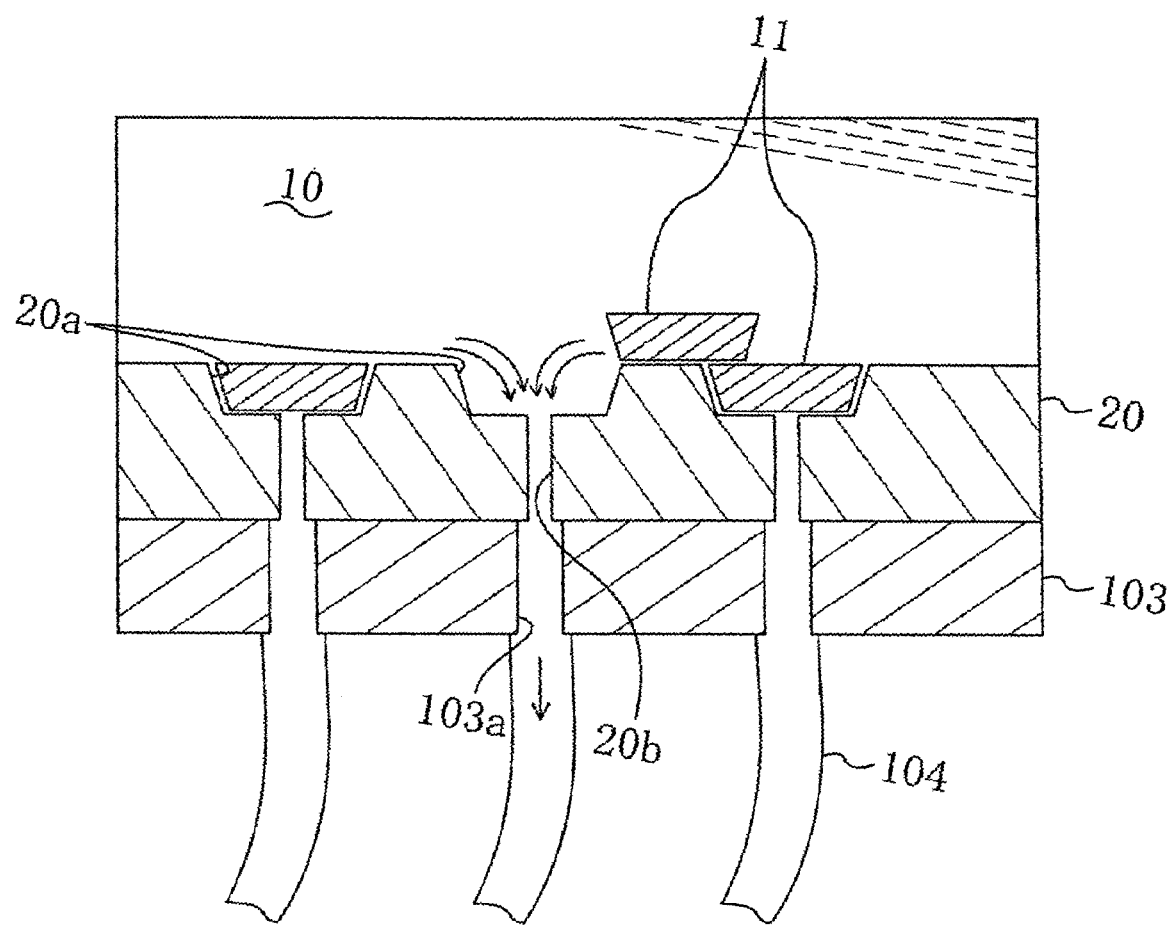
FIG. 6 is an enlarged view illustrating part of a cross sectional configuration of a block disposition portion and a substrate held thereon in the semiconductor-device fabrication apparatus of the second embodiment of the present invention.

FIG. 5 schematically illustrates a cross sectional configuration of a semiconductor-device fabrication apparatus according to the second embodiment of the present invention. FIG. 6 shows in enlarged scale a block disposition portion and a substrate held thereon. In FIGS. 5 and 6, the same members as those shown in FIGS. 1 and 2 are identified by the same reference numerals and the description thereof will be omitted herein.

As shown in FIGS. 5 and 6, the semiconductor-device fabrication apparatus 100 of the second embodiment includes a plurality of pipes 104 connected to individual openings 103a formed in the block disposition portion 103. The pipes 104 are connected at their respective lower ends to a collection pipe 105 for gathering together a liquid 10 flowing through the respective pipes 104. The liquid 10 gathered in the collection pipe 105 is mixed with a liquid 10 collected from an outlet portion 102.

In the second embodiment, the liquid 10 flows externally from the block disposition portion 103 through recessed portions 20a and through holes 20b formed in the substrate 20 and through the openings 103a formed in the block disposition portion 103, thereby generating sucking force above the recessed portions 20a. Therefore, function blocks 11 are effectively disposed into the recessed portions 20a formed in the substrate 20. In addition, the pipes 104 formed under the openings 103a and the collection pipe 105 ensure that the liquid 10 flowing externally from the openings 103a is collected.

It should be noted that the liquid 10 may be sucked in a positive way by a pump or the like from the downstream side of the collection pipe 105.

Modified Example of the Second Embodiment

Figure 7:
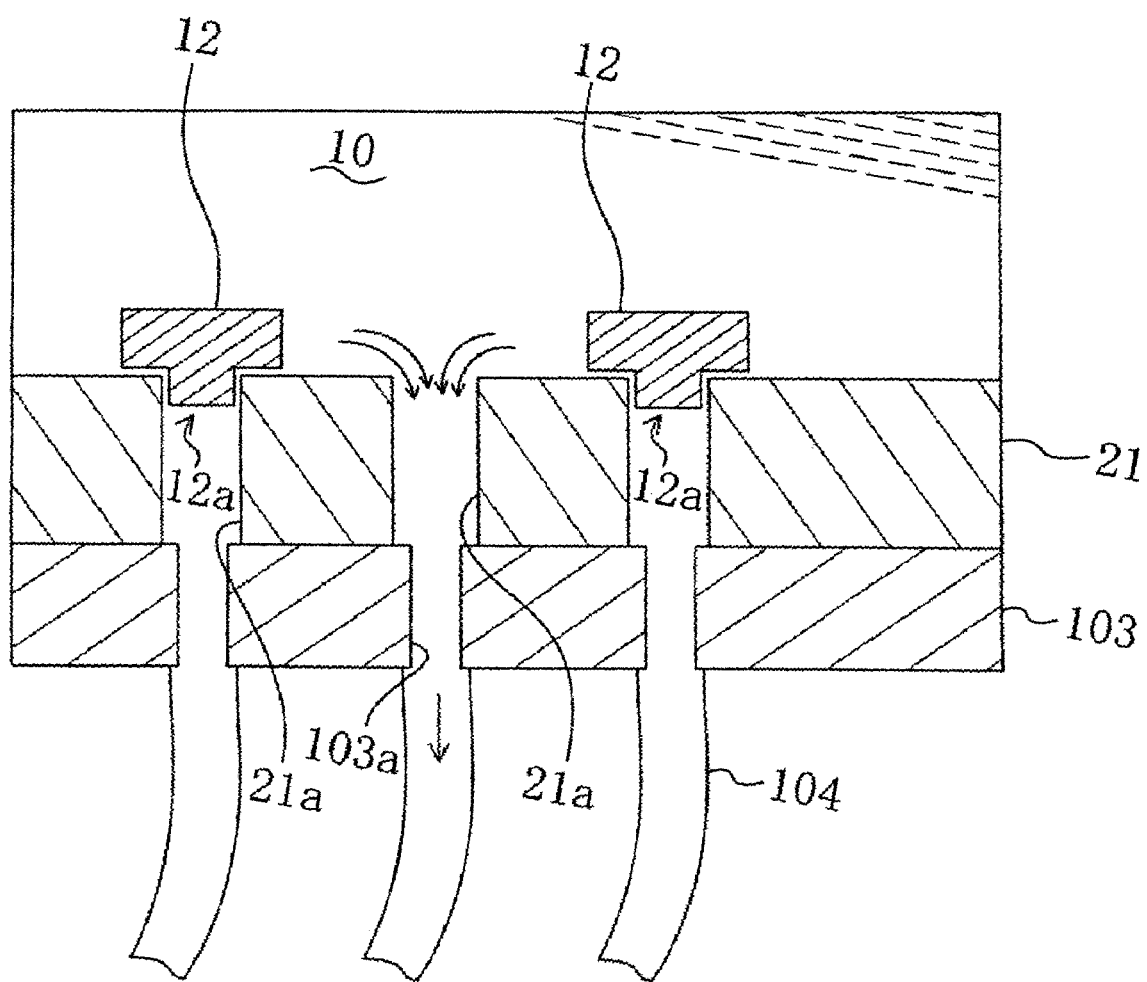
FIG. 7 is an enlarged view illustrating part of a cross sectional configuration of a block disposition portion and a substrate held thereon in a semiconductor-device fabrication apparatus according to a modified example of the second embodiment of the present invention.

Hereinafter, a modified example of the second embodiment of the present invention will be described with reference to FIG. 7. As shown in an enlarged partial view in FIG. 7, in a substrate 21 according to this modified example, through holes 21a are formed without forming any recessed portions. And function blocks 12 are each formed to have, on their lower side, a projection 12a which fits into one of the through holes 21a in the substrate 21.

In this modified example, sucking force is also generated above the through holes 21a, when a liquid 10 flows through the through holes 21a formed in the substrate 21. The sucking force produced in the liquid 10 causes the function blocks 12 to be sucked into the empty through holes 21a. As a result, the projections 12a of the function blocks 12 are effectively disposed into the through holes 21a formed in the substrate 21. In addition, the liquid 10 flowing externally from openings 103a of a block disposition portion 103 is collected reliably.

Third Embodiment

Hereinafter, a third embodiment of the present invention will be described with reference to the accompanying drawings.

Figure 8:
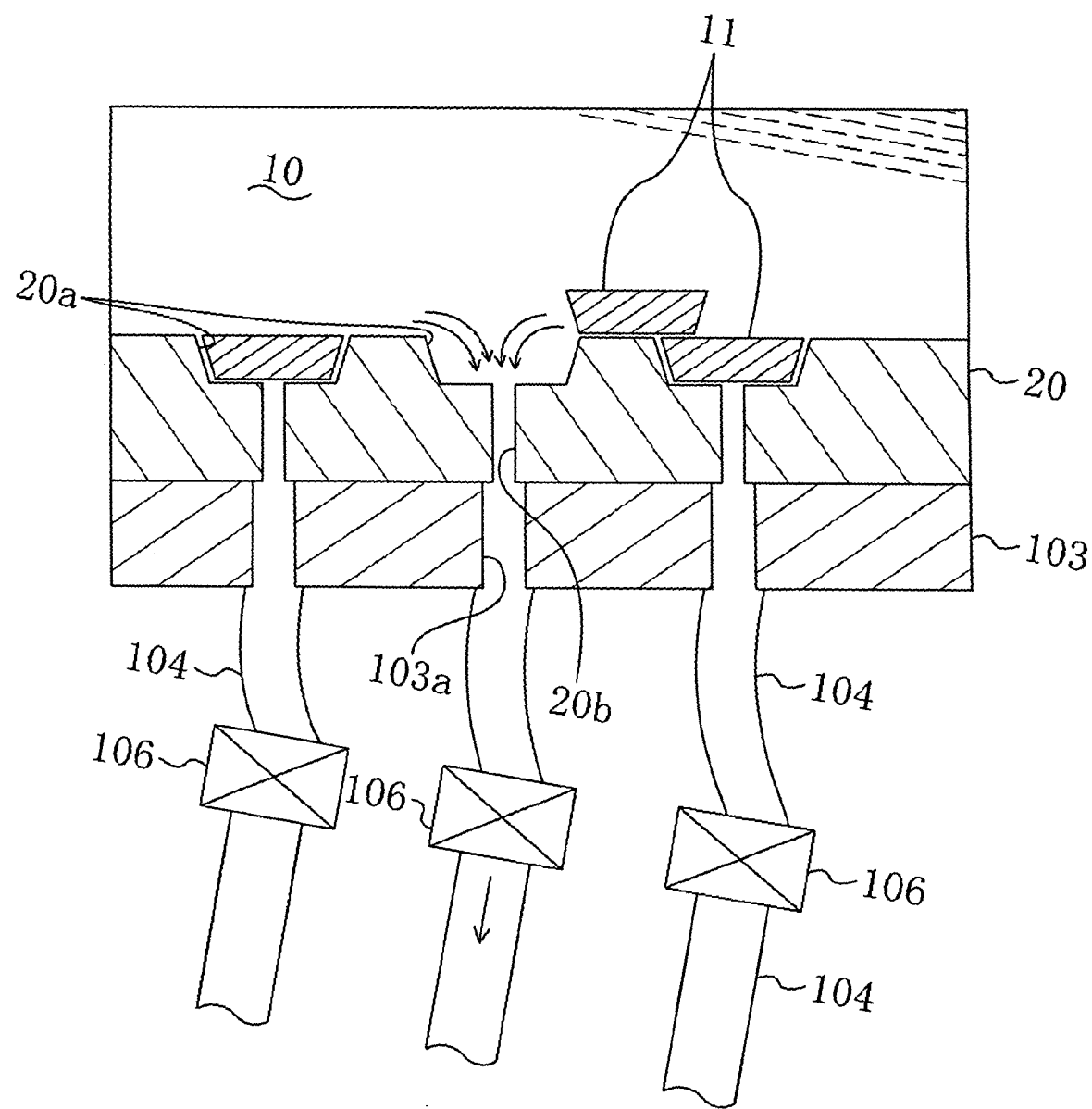
FIG. 8 is an enlarged view illustrating part of a cross sectional configuration of a block disposition portion and a substrate held thereon in a semiconductor-device fabrication apparatus according to a third embodiment of the present invention.

FIG. 8 shows in enlarged scale a block disposition portion and a substrate held thereon in a semiconductor-device fabrication apparatus according to the third embodiment of the present invention. In FIG. 8, the same members as those shown in FIG. 6 are identified by the same reference numerals and the description thereof will be omitted herein.

As shown in FIG. 8, in the semiconductor-device fabrication apparatus of the third embodiment, magnetic valves 106 are interposed in pipes 104 formed under openings 103a of a block disposition portion 103. The magnetic valves 106 can be selectively opened or closed from outside the apparatus.

In the third embodiment, when the magnetic valves 106 are opened, a liquid 10 flows externally from the block disposition portion 103 through through holes 20b formed in a substrate 20 and through the openings 103a formed in the block disposition portion 103, thereby generating sucking force above recessed portions 20a. Therefore, function blocks 11 are effectively disposed into the recessed portions 20a formed in the substrate 20. In addition, by opening or closing the magnetic valves 106, it is possible to adjust how easily the function blocks 11 are disposed into the recessed portions 20a formed in the substrate 20.

Modified Example of the Third Embodiment

Figure 9:
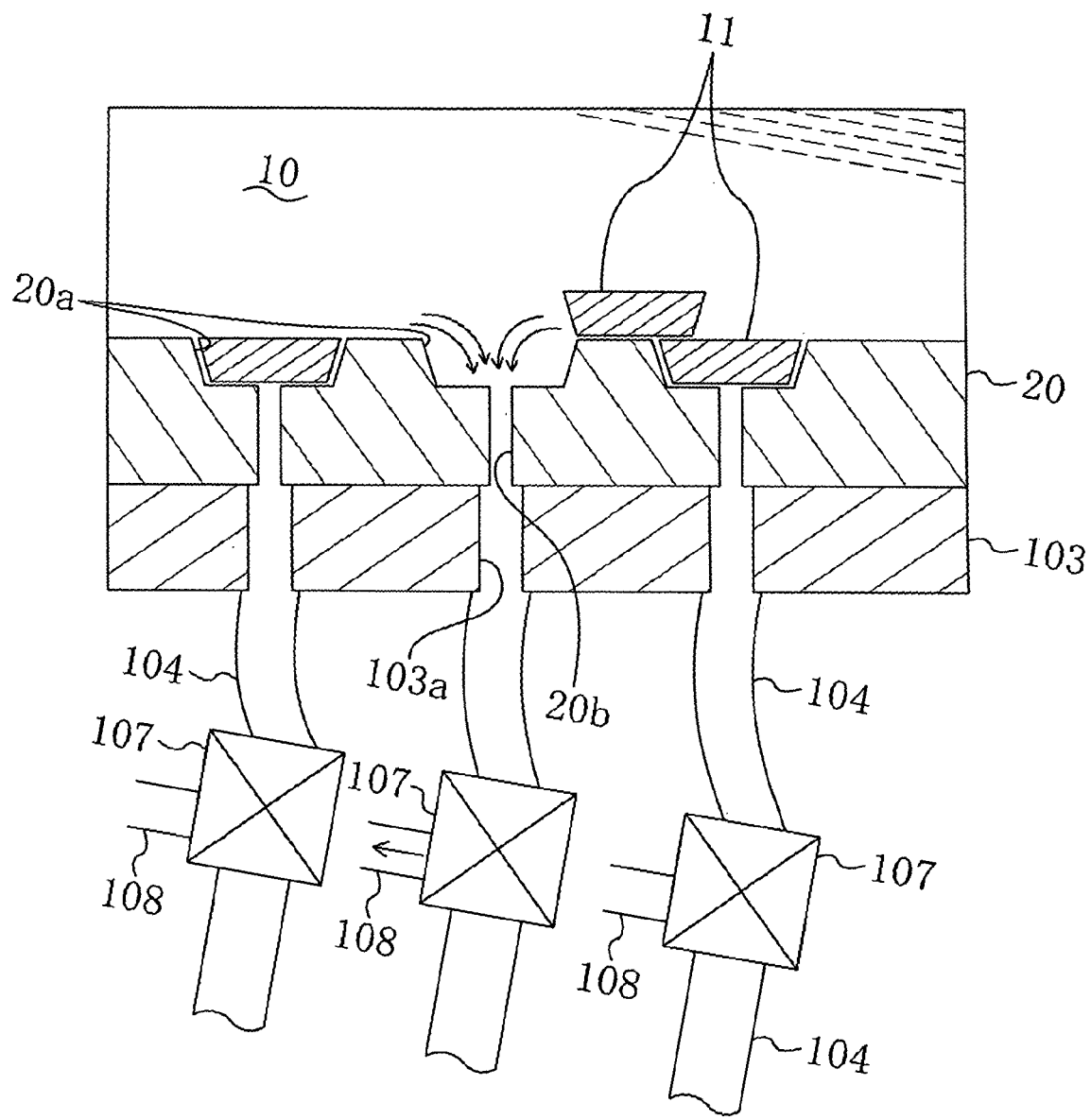
FIG. 9 is an enlarged view illustrating part of a cross sectional configuration of a block disposition portion and a substrate held thereon in a semiconductor-device fabrication apparatus according to a modified example of the third embodiment of the present invention.

Hereinafter, a modified example of the third embodiment of the present invention will be described with reference to FIG. 9. As shown in an enlarged partial view in FIG. 9, in this modified example, magnetic valves interposed in pipes 104 are three-way valves 107 which are capable of producing outputs in two directions. Therefore, if the amount of flow output from first outlets (i.e., the pipes 104) of the three-way valves 107 is set to a different value than the amount of flow produced from second outlets thereof (i.e., pipes 108), it is possible to adjust how easily the function blocks 11 are disposed into the recessed portions 20a formed in the substrate 20 in three stages: a first open state in which the first outlets are open, a second open state in which the second outlets are open, and a close state.

It should be noted that in the third embodiment and the modified example thereof, a substrate 21 in which through holes 21a are formed may be used as in the modified example of the second embodiment.

Forth Embodiment

Hereinafter, a fourth embodiment of the present invention will be described with reference to the accompanying drawings.

Figure 10:
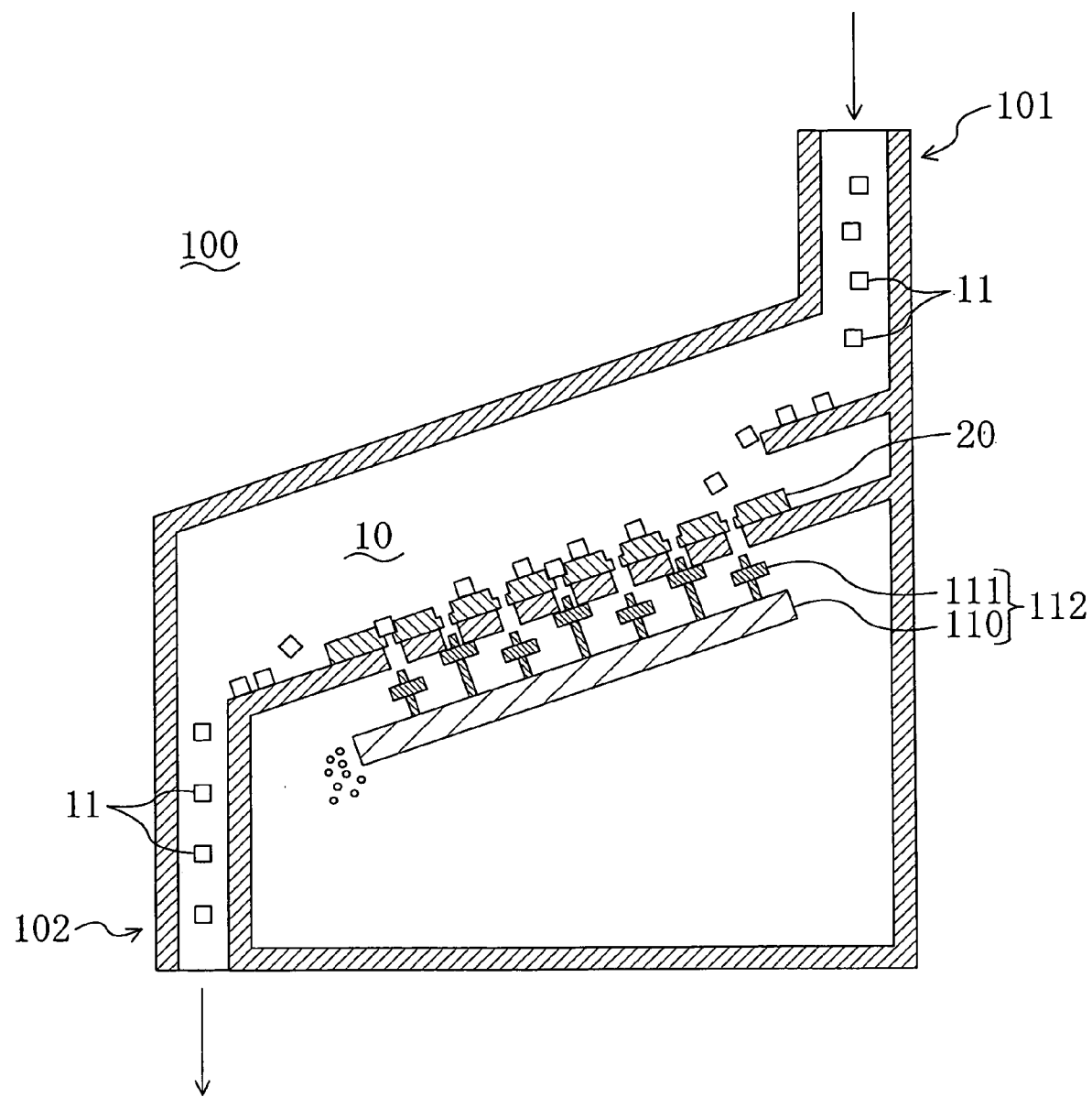
FIG. 10 schematically illustrates a cross sectional configuration of a semiconductor-device fabrication apparatus according to a fourth embodiment of the present invention.
Figure 11:
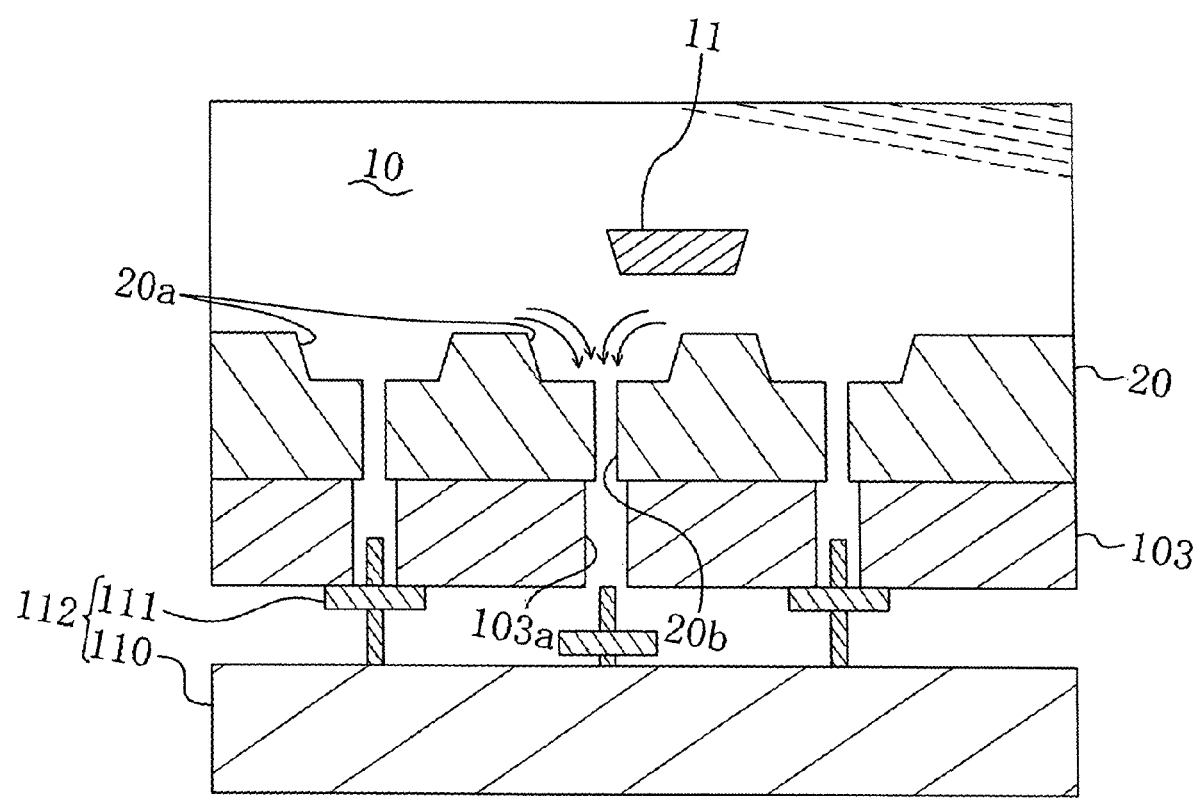
FIG. 11 is an enlarged view illustrating part of a cross sectional configuration of a block disposition portion and a substrate held thereon in the semiconductor-device fabrication apparatus of the fourth embodiment of the present invention.

FIG. 10 schematically illustrates a cross sectional configuration of a semiconductor-device fabrication apparatus according to the fourth embodiment of the present invention, while FIG. 11 shows in enlarged scale a block disposition portion and its vicinity. In FIGS. 10 and 11, the same members as those shown in FIGS. 1 and 2 are identified by the same reference numerals and the description thereof will be omitted herein.

As shown in FIGS. 10 and 11, a semiconductor-device fabrication apparatus 100 according to the fourth embodiment includes an opener/closer 112 formed under a block disposition portion 103. The opener/closer 112 selectively opens or closes openings 103a of the block disposition portion 103, thereby selectively opening or closing through holes 20b formed under the bottoms of recessed portions 20a in a substrate 20.

The opener/closer 112 is formed of, e.g., an opener/closer body 110 having a cam mechanism, and a plurality of top-shaped valves 111 which are linked to the cam mechanism and open/close the openings 103a. Each valve 111 is formed of a rod and a fringe provided interposed in the rod. The upper portion of each rod above the fringe is inserted into one of the openings 103a of the block disposition portion 103.

In the fourth embodiment, when the valves 111 are opened, a liquid 10 flows externally from the block disposition portion 103 through the through holes 20b formed in the substrate 20 and through the openings 103a formed in the block disposition portion 103, thereby generating sucking force above the recessed portions 20a. Therefore, function blocks 11 are effectively disposed into the recessed portions 20a formed in the substrate 20. In addition, by opening or closing the valves 111, it is possible to adjust how easily the function blocks 11 are disposed into the recessed portions 20a formed in the substrate 20.

First Modified Example of the Fourth Embodiment

Figure 12:
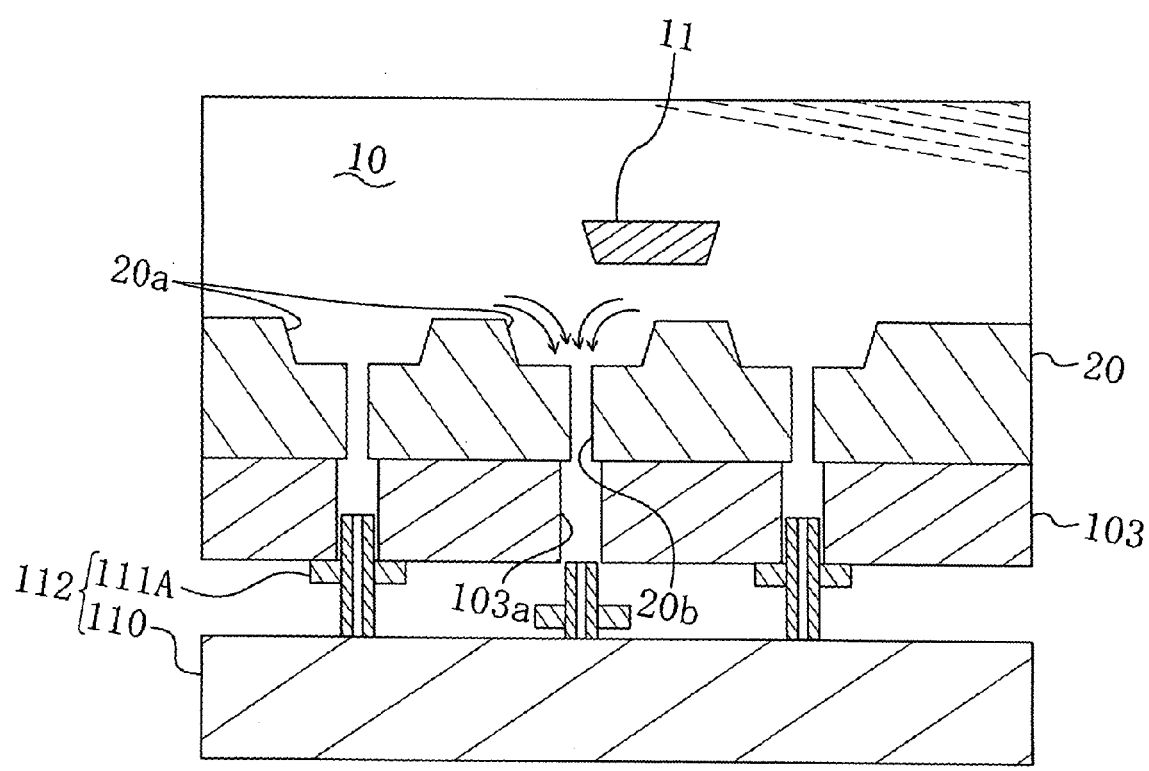
FIG. 12 is an enlarged view illustrating part of a cross sectional configuration of a block disposition portion and a substrate held thereon in a semiconductor-device fabrication apparatus according to a first modified example of the fourth embodiment of the present invention.

Hereinafter, a first modified example of the fourth embodiment of the present invention will be described with reference to FIG. 12. As shown in an enlarged partial view in FIG. 12, in the first modified example, the rods of valves 111A of an opener/closer 112 are made hollow so that each valve 111A has a nozzle structure in which a liquid 10 is injected from the upper end of the valve 111A.

Figure 13:
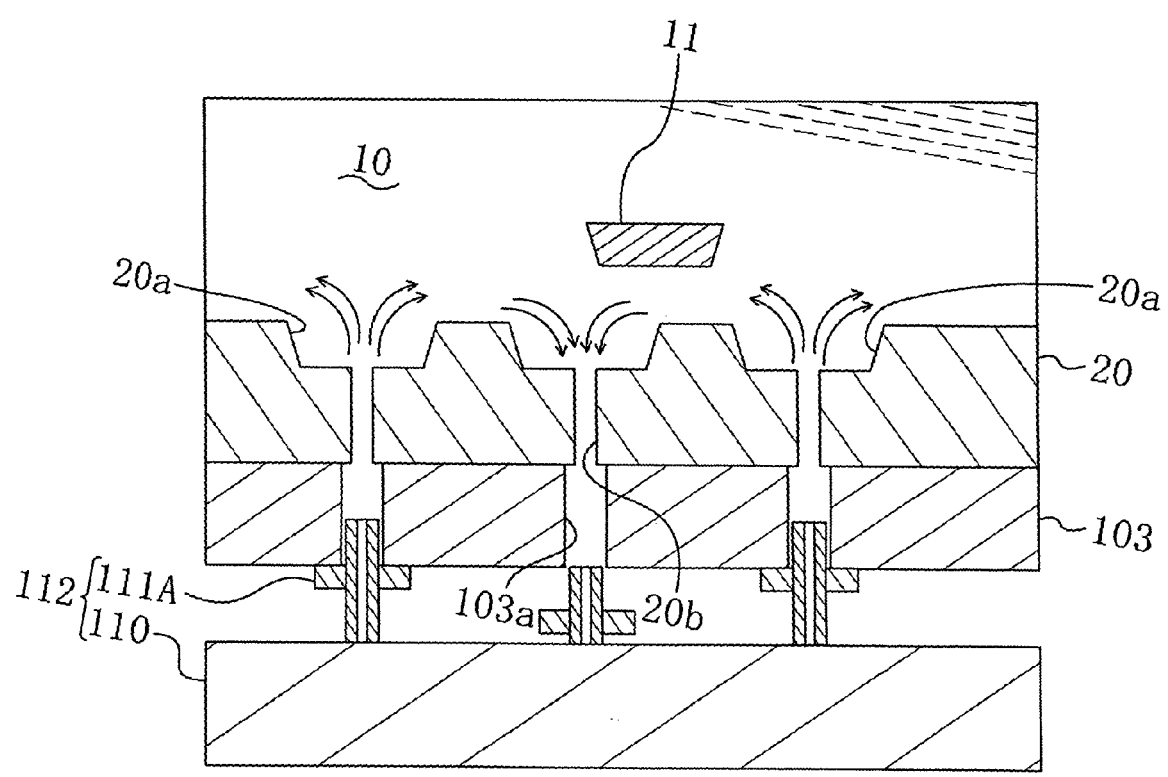
FIG. 13 is an enlarged view illustrating part of a cross sectional configuration of the block disposition portion and the substrate held thereon in the semiconductor-device fabrication apparatus according to the first modified example of the fourth embodiment of the present invention.

Therefore, as shown in FIG. 13, if the valves 111A under empty recessed portions 20a are closed and the liquid 10 is injected from the nozzles of these valves 111A, the stream of water resulting from the liquid injection prevents function blocks 11 from falling into these empty recessed portions 20a.

Thus, in a case where the function blocks 11 are to be selectively disposed in the recessed portions 20a in the substrate 20, it is possible to reliably avoid the function blocks 11 from falling into those recessed portions 20a in which no function blocks 11 are desired to be disposed.

In the empty recessed portions 20a, other function blocks having different functions and properties than the function blocks 11, e.g., laser chips having a different oscillation wavelength, may be arranged in the next process step.

The liquid 10 may be injected from the nozzles of the valves 111A, when the liquid 10, in which the function blocks 11 have been spread, is flowing or after the liquid 10 has flowed.

Also, what injected from the nozzles of the valves 111A is not limited to the liquid 10 but may be a gas, for example, air.

Second Modified Example of the Fourth Embodiment

Figure 14:
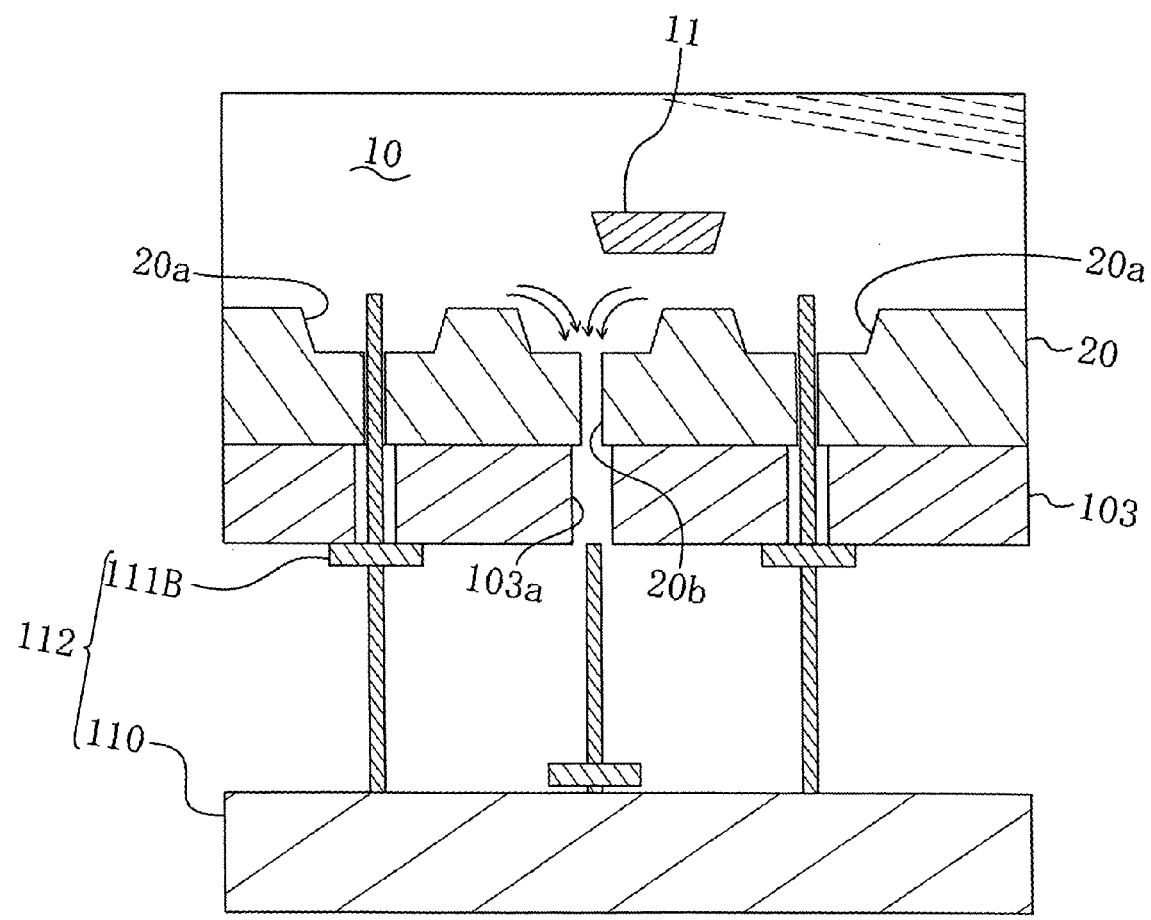
FIG. 14 is an enlarged view illustrating part of a cross sectional configuration of a block disposition portion and a substrate held thereon in a semiconductor-device fabrication apparatus according to a second modified example of the fourth embodiment of the present invention.

Hereinafter, a second modified example of the fourth embodiment of the present invention will be described with reference to FIG 14. As shown in an enlarged partial view in FIG. 14, in the second modified example, the rod length of valves 111B of an opener/closer 112 are set to such a degree that the upper ends of the valves 111B protrude from the principal surface of a substrate 20 when the valves 111B are closed.

Then, when function blocks 11 are to be selectively disposed into recessed portions 20a in a substrate 20, it is possible to reliably avoid the function blocks 11 from falling into those recessed portions 20a in which no function blocks 11 are desired to be disposed.

It should be noted that the rod length of the valves 111B does not necessarily have to be set so that the upper ends of the valves 111B protrude from the principal surface of the substrate 20 but may be set to such a degree that the upper ends protrude from the bottoms of the recessed portions 20a.

Third Modified Example of the Fourth Embodiment

Figure 15:
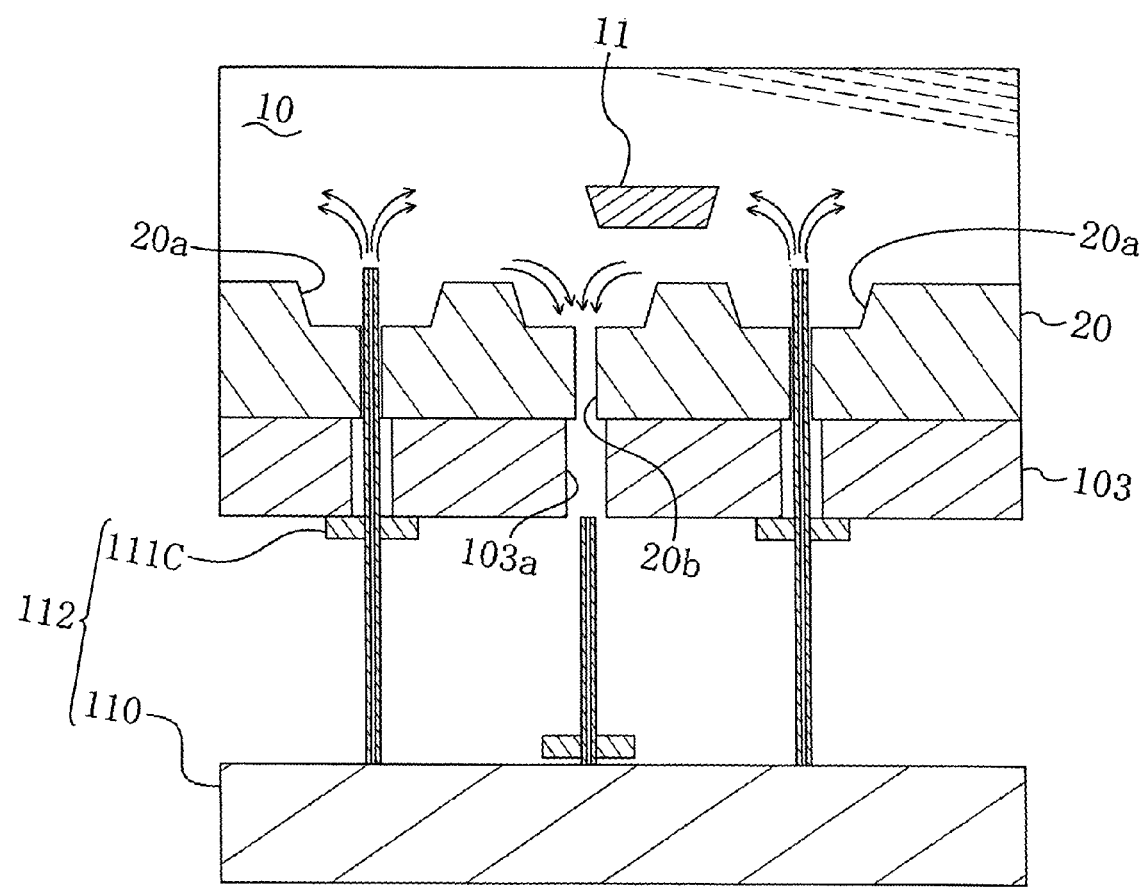
FIG. 15 is an enlarged view illustrating part of a cross sectional configuration of a block disposition portion and a substrate held thereon in a semiconductor-device fabrication apparatus according to a third modified example of the fourth embodiment of the present invention.

Hereinafter, a third modified example of the fourth embodiment of the present invention will be described with reference to FIG. 15. As shown in an enlarged partial view in FIG. 15, the third modified example employs valves 111C, which are obtained by setting the rod length of the valves 111B of the opener/closer 112 to such a degree that the upper ends of the valves 111B protrude from the principal surface of the substrate 20 when the valves 111B are closed, and in addition by making the respective rods of the valves 111B have a nozzle structure.

Thus, when function blocks 11 are to be selectively disposed into recessed portions 20a in a substrate 20, it is possible to more reliably avoid the function blocks 11 from falling into those recessed portions 20a in which no function blocks 11 are desired to be disposed.

It should be noted that the rod length of the valves 111C does not necessarily have to be set so that the upper ends of the valves 111C protrude from the principal surface of the substrate 20 but may be set to such a degree that the upper ends protrude from the bottoms of the recessed portions 20a.

Also, what injected from the nozzles of the valves 111C is not limited to the liquid 10 but may be a gas, for example, air.

Moreover, in the fourth embodiment and the modified examples thereof, a substrate 21 formed with through holes 21a may be used as in the modified example of the second embodiment.

As described above, the inventive semiconductor-device fabrication methods and the inventive semiconductor-device fabrication apparatuses are effective in effectively and in addition selectively disposing a plurality of semiconductor elements into a plurality of recessed portions. The inventive methods and apparatuses are thus applicable as semiconductor-device fabrication methods and semiconductor-device fabrication apparatuses which enable semiconductor elements to be mounted on a substrate in a self-aligned manner.

What is claimed is:

1. A method for fabricating a semiconductor device comprising:
    the step of forming a plurality of recessed portions in a principal surface of a substrate;
    the step of forming, in the substrate, through holes each passing through the substrate in a front-to-back direction of the substrate, each of the through holes being formed under a portion of a bottom of each recessed portion; and
    the step of spreading a plurality of semiconductor elements in the form of chips in a liquid and then pouring the semiconductor-element-spread liquid over the principal surface of the substrate, while passing the liquid through the through holes, so that the semiconductor elements fit into the recessed portions in a self-aligned manner, thereby disposing the semiconductor elements on the substrate.

2. The method of claim 1, wherein in the step of disposing the semiconductor elements, the liquid is sucked from the through holes under the recessed portions.

3. The method of claim 2, wherein in the step of disposing the semiconductor elements, the liquid is sucked selectively from the through holes.

4. The method of claim 1, wherein in the step of disposing the semiconductor elements, the through holes are selectively opened or closed.

5. The method of claim 1, wherein in the step of disposing the semiconductor elements, insert members, which close the through holes from the side of the substrate opposite the principal surface of the substrate and are removable, are selectively inserted.

6. The method of claim 5, wherein the insert members are nozzles through which liquid or gas can pass.

7. The method of claim 6, wherein liquid or gas is injected from the nozzles.

8. The method of claim 5, wherein the insert members are inserted so that the upper ends of the insert members protrude from the principal surface of the substrate.

9. The method of claim 1, wherein liquid or gas is selectively injected from the through holes to areas above the principal surface of the substrate.

10. The method of claim 1, wherein in the step of disposing the semiconductor elements, the liquid is sucked from the through holes, thereby securing the semiconductor elements onto the substrate.

11. The method of claim 1, further comprising, before the step of disposing the semiconductor elements, the step of forming an element electrode on a face of each semiconductor element which faces the bottom of one of the recessed portions,
    wherein the step of forming the recessed portions in the substrate includes the step of forming a recess electrode on the bottom of each recessed portion, and
    in the step of disposing the semiconductor elements, each semiconductor element is electrically connected with a corresponding one of the recess electrodes via the element electrode.

12. The method of claim 11, wherein in the recess electrode formation step, each recess electrode is formed so that an end portion thereof extends beyond the principal surface of the substrate.

13. The method of claim 1, wherein in the step of forming the recessed portions in the substrate, the recessed portions are formed so as to have different plan configurations in accordance with the shapes of the semiconductor elements.

14. A method for fabricating a semiconductor device comprising:

the step of forming, in a principal surface of a substrate, a plurality of through holes each passing through the substrate in a front-to-back direction of the substrate; and the step of spreading in a liquid a plurality of semiconductor elements in the form of chips, each having in a lower portion thereof a projection which fits in one of the through holes, and then pouring the semiconductor-element-spread liquid over the principal surface of the substrate, while passing the liquid through the through holes, so that the projections of the semiconductor elements fit into the through holes in a self-aligned manner, thereby disposing the semiconductor elements on the substrate.

15. The method of claim 14, wherein in the step of disposing the semiconductor elements, the liquid is sucked from the through holes.

16. The method of claim 15, wherein in the step of disposing the semiconductor elements, the liquid is sucked selectively from the through holes.

17. The method of claim 14, wherein in the step of disposing the semiconductor elements, the through holes are selectively opened or closed.

18. The method of claim 14, wherein in the step of disposing the semiconductor elements, insert members, which close the through holes from the side of the substrate opposite the principal surface of the substrate and are removable, are selectively inserted.

19. The method of claim 18, wherein the insert members are nozzles through which liquid or gas can pass.

20. The method of claim 19, wherein liquid or gas is injected from the nozzles.

21. The method of claim 18, wherein the insert members are inserted so that the upper ends of the insert members protrude from the principal surface of the substrate.

22. The method of claim 14, wherein liquid or gas is selectively injected from the through holes to areas above the principal surface of the substrate.

23. The method of claim 14, wherein in the step of disposing the semiconductor elements, the liquid is sucked from the through holes, thereby securing the semiconductor elements onto the substrate.

24. The method of claim 14, further comprising, before the step of disposing the semiconductor elements, the step of forming an element electrode on the projection of each semiconductor element where the projection is in contact with one of the through holes, wherein the step of forming the through holes in the substrate includes the step of forming a recess electrode on a portion of the principal surface of the substrate surrounding each through hole or on an internal face of each through hole, and in the step of disposing the semiconductor elements, each semiconductor element is electrically connected with a corresponding one of the recess electrodes via the element electrode.

* * * * *